(12) United States Patent
Hotta

(10) Patent No.: US 9,472,942 B2
(45) Date of Patent: Oct. 18, 2016

(54) CURRENT SENSOR, AND POWER CONVERSION APPARATUS

(71) Applicant: TOYOTA JIDOSHA KABUSHIKI KAISHA, Toyota-shi, Aichi (JP)

(72) Inventor: Koji Hotta, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/912,490

(22) PCT Filed: Sep. 18, 2014

(86) PCT No.: PCT/JP2014/074675
§ 371 (c)(1),
(2) Date: Feb. 17, 2016

(87) PCT Pub. No.: WO2015/049997
PCT Pub. Date: Sep. 4, 2015

(65) Prior Publication Data
US 2016/0204597 A1   Jul. 14, 2016

(30) Foreign Application Priority Data
Oct. 3, 2013   (JP) ................. 2013-208563

(51) Int. Cl.
| | | |
|---|---|---|
| *H01H 39/00* | (2006.01) | |
| *H02H 3/08* | (2006.01) | |
| *H02H 7/08* | (2006.01) | |
| *H02H 7/122* | (2006.01) | |
| *H02M 7/537* | (2006.01) | |
| *H02M 1/088* | (2006.01) | |
| *G01R 19/00* | (2006.01) | |
| *G01R 15/20* | (2006.01) | |
| *H02M 1/00* | (2006.01) | |

(52) U.S. Cl.
CPC ............ *H02H 7/08* (2013.01); *G01R 15/202* (2013.01); *G01R 19/0092* (2013.01); *H02H 7/1225* (2013.01); *H02M 1/088* (2013.01); *H02M 7/537* (2013.01); *H02M 2001/0009* (2013.01)

(58) Field of Classification Search
CPC ............................... H01H 39/00; H02H 3/08
USPC ........ 337/298, 401–409, 414; 335/6, 51, 52, 335/68
See application file for complete search history.

(56) References Cited

U.S. PATENT DOCUMENTS

| 4,224,487 A | * | 9/1980 | Simonsen | ............ | H01H 39/006 |
| | | | | | 200/61.08 |
| 5,877,563 A | * | 3/1999 | Krappel | ............... | H01H 39/006 |
| | | | | | 180/271 |
| 6,411,190 B1 | * | 6/2002 | Yamaguchi | ............ | H01H 39/00 |
| | | | | | 180/279 |
| 7,078,635 B2 | * | 7/2006 | Kordel | ................. | H01H 39/006 |
| | | | | | 200/61.08 |
| 7,123,124 B2 | * | 10/2006 | Caruso | ................. | H01H 39/006 |
| | | | | | 200/61.08 |

FOREIGN PATENT DOCUMENTS

| JP | H09-304447 | * | 11/1997 |
| JP | 2001-052584 | * | 2/2001 |
| JP | 2007-312491 | * | 11/2007 |
| JP | 2012-029459 | * | 2/2012 |

* cited by examiner

Primary Examiner — Bentsu Ro
(74) Attorney, Agent, or Firm — Oliff PLC

(57) ABSTRACT

A current sensor and so forth are provided capable of detecting an overcurrent of a wiring line and disconnecting the wiring line while reducing layout space and cost. A current detection part detecting a current flowing through the wiring line, a disconnection mechanism disconnecting the wiring line, and a drive circuit driving the disconnection mechanism are included in the same housing. A current detection circuit included in the current detection part and the drive circuit are placed on the same substrate.

8 Claims, 14 Drawing Sheets

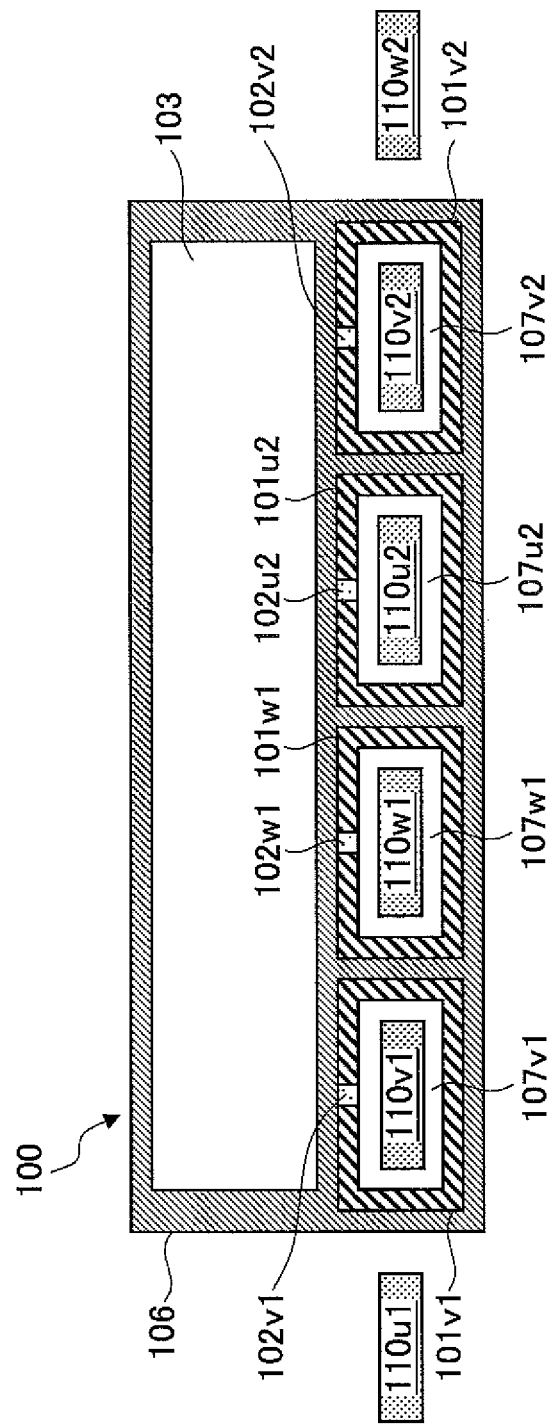

CURRENT SENSOR, AND POWER CONVERSION APPARATUS

TECHNICAL FIELD

The present invention relates to a current sensor, and a power conversion apparatus.

BACKGROUND ART

A technology has been known which, for the purpose of avoiding an adverse effect due to an overcurrent, detects an overcurrent flowing through a wiring line, and disconnects the wiring line where the overcurrent flows (for example, Patent Reference 1).

A power conversion apparatus of Patent Reference 1 destroys a part of a wiring line (for example, breaks the wiring line with a pressing member such as a piston) when an overcurrent is detected by an overcurrent detecting means in the connecting wiring line connected with a three-phase alternating current rotating electric motor. Thereby, a failure in the rotating electric motor, abnormal heat generation of a circuit including a power conversion apparatus and the rotating electric motor due to the overcurrent flowing continuously, and so forth, are avoided.

PRIOR ART REFERENCE

Patent Reference

PATENT REFERENCE 1: Japanese Laid-Open Patent Application No. 2007-312491
PATENT REFERENCE 2: Japanese Laid-Open Patent Application No. 2012-029459

SUMMARY OF THE INVENTION

Problem to be Solved by the Invention

However, a problem may occur concerning layout space and cost because it is necessary to provide, in addition to a current sensor as an overcurrent detecting means, a circuit disconnection means (for example, a piston and a pyro mechanism driving the piston, and/or the like).

Therefore, in consideration of the above-mentioned problem, an object is to provide a current sensor or the like capable of detecting an overcurrent in a wiring line and disconnecting the wiring line while reducing layout space and cost.

Means to Solve the Problem

In order to achieve the above-mentioned object, in one embodiment, a current sensor includes, in the same hosing,
a current detection part detecting a current flowing through a wiring line,
a disconnection mechanism disconnecting the wiring line, and
a drive circuit driving the disconnection mechanism, wherein
a current detection circuit included in the current detection part and the drive circuit are placed on the same substrate.

Advantageous Effects of the Invention

According to the present embodiment, it is possible to provide a current sensor or the like capable of detecting an overcurrent in a wiring line and disconnecting the wiring line while reducing layout space and cost.

BRIEF DESCRIPTION OF DRAWINGS

FIG. 8C is a schematic view showing the example of the structure of the current sensor according to the third embodiment.

DESCRIPTION OF EMBODIMENTS

Figure 1:
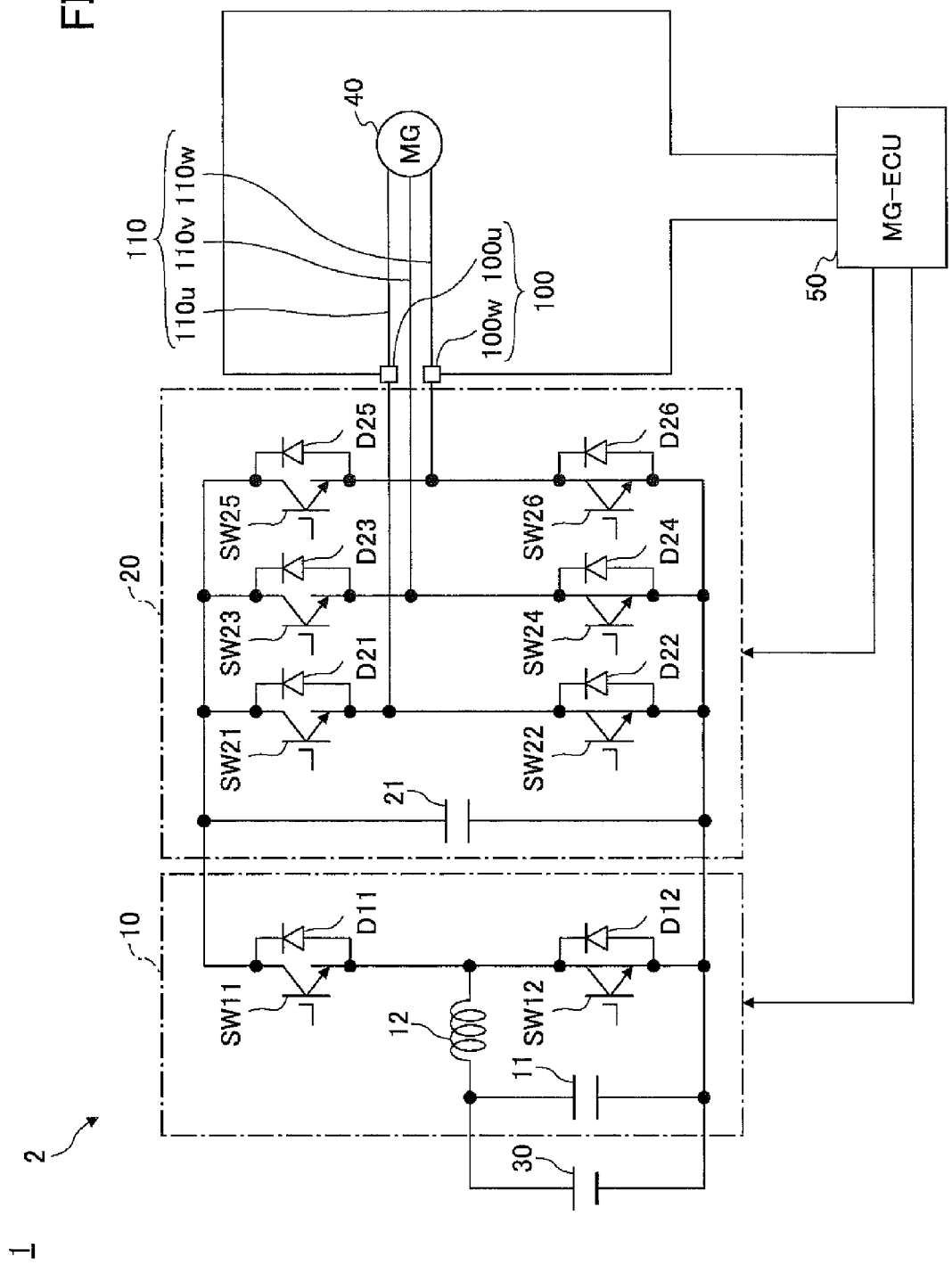
FIG. 1 is a system configuration diagram of a vehicle including a current sensor, and a power conversion apparatus according to a first embodiment.

Below, embodiments will be described using drawings.
[First Embodiment]
FIG. 1 is a block diagram showing a system configuration of a vehicle 1 including current sensors 100, and a power conversion apparatus 2 according to the present embodiment.

The vehicle 1 is an electric vehicle having an electric motor as a drive source. Note that the vehicle 1 can be a hybrid vehicle in which also an engine is installed, or can be an electric motor car using only the electric motor as the drive source.

The vehicle 1 includes a battery 30, a motor generator (hereinafter, referred to as a MG) 40, the power conversion apparatus 2, a MG-ECU 50, the current sensors 100, and so forth.

The battery 30 is an electric storage device supplying power to the MG 40. For example, a lithium ion battery, a nickel metal hydride battery, or the like, can be used. However, the battery 30 is not limited thereto, so that any type of a secondary battery can be used, or also a capacitor or the like can be used.

The MG 40 is a rotating electric motor as one drive source of the vehicle 1, and is also a generator. For example, the MG 40 can be such that the MG 40 drives the vehicle 1 with power supplied by the battery 30, and, when the vehicle 1 is decelerated, the MG 40 functions as a generator by carrying out a regeneration operation, and charges the battery 30 with power generated from the regeneration operation. If the vehicle 1 is a hybrid vehicle, the MG 40 can be such as to be driven by an internal-combustion engine (not shown) and generate power. Note that, the generated power can be supplied to another rotating electric motor installed in the vehicle 1, or be used to charge the battery 30. The MG 40 is driven by three-phase AC power supplied via an inverter 20 included in the power conversion apparatus 2 described later.

The power conversion apparatus 2 is a drive apparatus for driving the MG 40 with power supplied by the battery 30, and includes a step-up converter 10, and the inverter 20.

The step-up converter 10 increases the voltage of the battery 30 up to a predetermined voltage (the voltage driving the MG 40). The step-up converter 10 includes an input capacitor 11, a reactor 12, transistors SW11 and SW12, and so forth, and the step-up operation is implemented as a result of the MG-ECU 50 described later carrying out switching control of the transistors SW11 and SW12. Note that, the step-up converter 10 reduces the voltage of generated power supplied via the inverter 20, and supplies the power to the battery 30, when the MG 40 generates the power, for example. In case of step down, in the same way as the case of step up, the step-down operation is implemented as a result of the MG-ECU 50 carrying out switching control of the transistors SW11 and SW12. Note that, the step-up converter 10 includes a drive circuit (not shown) for the transistors SW11 and SW12, and the switching control by the MG-ECU 50 is carried out via the drive circuit.

The inverter 20 converts the DC power supplied by the battery 30 via the step-up converter 10 into three-phase AC power, and supplies the power to the MG 40. The inverter 20 includes transistors SW21 (upper arm) and SW22 (lower arm) for a U-phase, transistors SW23 (upper arm) and SW24 (lower arm) for a V-phase, and transistors SW25 (upper arm) and SW26 (lower arm) for a W-phase. The inverter 20 is capable of converting the DC power into the three-phase AC power as a result of the MG-ECU 50 described later carrying out switching control of the transistors SW21-SW26, and supplying the power to the MG 40. Note that, the inverter 20 includes a drive circuit (not shown) for the transistors SW21-SW26, and the switching control by the MG-ECU 50 is carried out via the drive circuit.

The inverter 20 includes a smoothing capacitor 21. The smoothing capacitor 21 is provided to smooth the current that is input to the inverter 20, and suppresses noise radiation and a surge voltage.

The MG-ECU 50 is a control unit carrying out driving control of the MG 40. The MG-ECU 50 includes a ROM storing control programs, a CPU loading a predetermined program from the ROM and carrying out processing, a readable and writable RAM storing the processing result and so forth, a timer, a counter, an input/output interface, and so forth. The MG-ECU 50 implements various processes such as control of the step-up converter 10, control of the MG 40 via the inverter 20, driving control of disconnection mechanisms of the current sensors 100, and so forth, described later, by executing the various control programs on the CPU.

The MG-ECU 50 controls the step-up operation of the step-up converter 10. Actually, in order to increase the voltage supplied by the battery 30 to the predetermined voltage (the voltage to drive the MG 40), the MG-ECU 50 carries out feedback control based on a signal from a voltage sensor (not shown) that measures the output-side voltage of the step-up converter 10. The MG-ECU 50 calculates the duty ratios of the transistors SW11 and SW12, and/or the like, and outputs a PWM (Pulse Width Modulation) signal to the step-up converter 10 (the drive circuit).

The MG-ECU 50 receives a torque command that is calculated by an integrated control ECU (not shown) of the vehicle 1 based on the amount of an accelerator operation made by the driver, the state of the battery 30, the vehicle states, and so forth, and controls the MG 40 via the inverter 20 in such a manner that the torque according to the torque command will be output. Actually, the MG-ECU 50 can be such as to control the MG 40 in a feedback control manner based on signals from a rotational speed sensor installed at the MG 40, current sensors 100 (100$u$ and 100$w$) installed at the connecting wiring lines 110 (110$u$ and 110$w$) connected to the coils of the U-phase and the W-phase of the MG 40, and so forth. The MG-ECU 50 calculates the duty ratios of the transistors SW21 through SW26, and/or the like, and outputs PWM signals to the inverter 20 (the drive circuit).

Further, the MG-ECU 50 determines whether an overcurrent flows through the connecting wiring lines 110 (110$u$, 110$v$, and 110$w$) connected to the coils of the U-phase, the V-phase, and the W-phase of the MG 40 based on the output signals from the current sensors 100. If determining that an overcurrent is flowing, the MG-ECU 50 transmits driving signals to drive the disconnection mechanisms described later to drive circuits, and disconnects the connecting wiring lines 110 (110$u$ and 110$v$). The disconnection process of disconnecting the connecting wiring lines 110$u$ and 110$v$ when an overcurrent flows will be described later in detail.

The current sensors 100 detect the currents of the connecting wiring lines 110$u$ and 110$w$ connected to the U-phase and the W-phase of the MG 40 from among the connecting wiring lines 110 (110$u$, 110$v$, and 110$w$) connected from the inverter 20 to the MG 40. The current sensors 100 include the current sensor 100$u$ detecting the current of the connecting wiring line 110$u$ of the U-phase and the current sensor 100$w$ detecting the current of the connecting wiring line 110$w$ of the W-phase. The output signals of the current sensors 100$u$ and 100$w$ are, as described above, input to the MG-ECU 50, and are used to control the MG 40 (feedback control). Also, as described above, based on the output signals of the current sensors 100$u$ and 100$w$, the MG-ECU 50 determines whether an overcurrent flows through the connecting wiring line 110$u$, 110v, or 110w. Note that, the MG-ECU 50 is capable of calculating the current value of the connecting wiring line 110v from the current values of the connecting wiring lines 110u and 110w based on the output signals of the current sensors 100u and 100w.

The current sensors 100 have the disconnection mechanisms in the same housings. The disconnection mechanisms are provided to disconnect the wiring lines for which the current sensors 100 detect the currents. Although details will be described later, the current sensors 100 have the drive circuits to drive the disconnection mechanisms, and the disconnection mechanisms are driven as a result of the MG-ECU 50 that determines that an overcurrent flows transmitting the driving signals to the drive circuits.

Below, the current sensors 100 according to the present embodiment will be described in detail.

Figure 2:
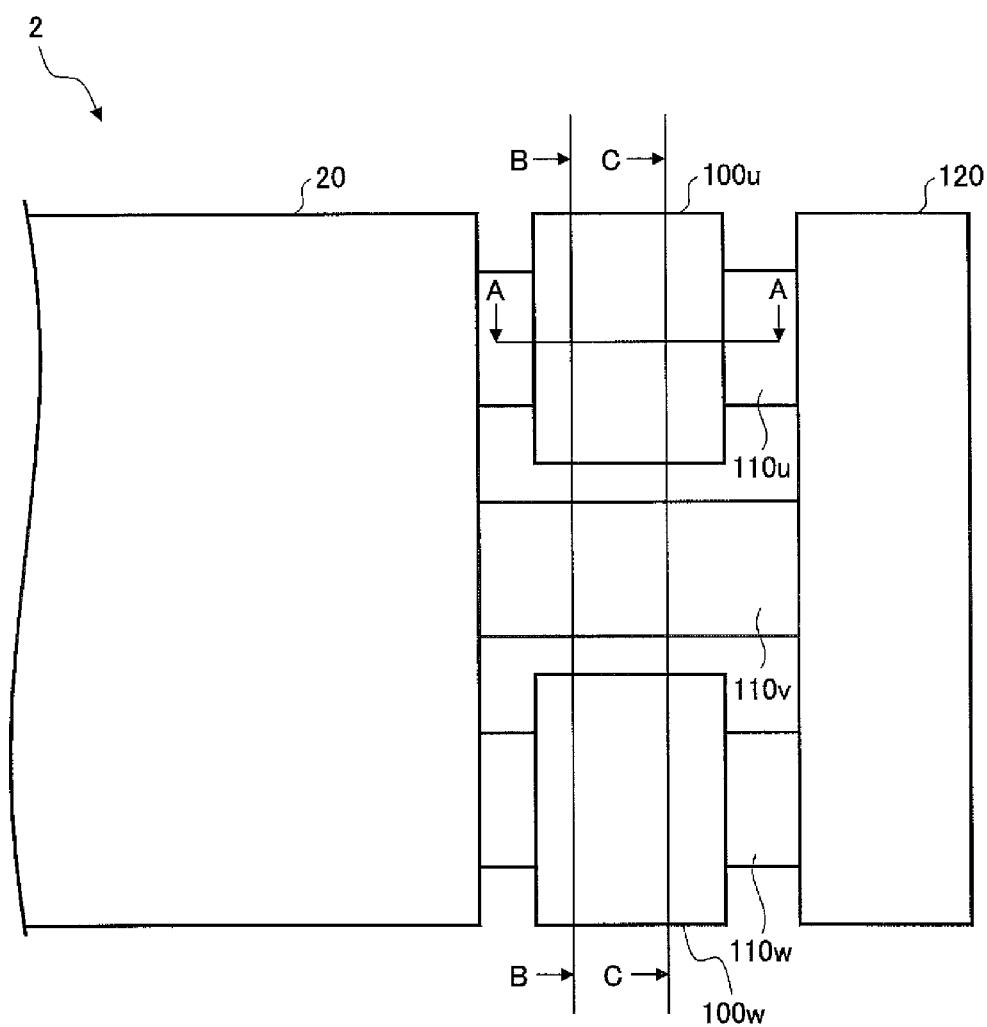
FIG. 2 shows one example of an arrangement of the current sensor according to the first embodiment.

FIG. 2 shows one example of an arrangement of the current sensors 100 (100u and 100w) according to the present embodiment. FIG. 2 shows an output part of the power conversion apparatus 2 in plan view. Between the inverter 20 and an output terminal 120, the connecting wiring line 110u of the U-phase, the connecting wiring line 110v of the V-phase, and the connecting wiring line 110w of the W-phase, in three-phase alternating currents, are installed. Note that, the output terminal 120 is a terminal to be connected to a wiring harness (not shown) to be connected to the MG 40.

As shown in FIG. 2, the connecting wiring lines 110u, 110v, and 110w are bus bars made of electrically conductive plates. The current sensor 100u is arranged in such a manner as to surround the connecting wiring line 110u of the U-phase. The current sensor 100w is arranged in such a manner as to surround the connecting wiring line 110w of the W-phase.

Figure 3A:
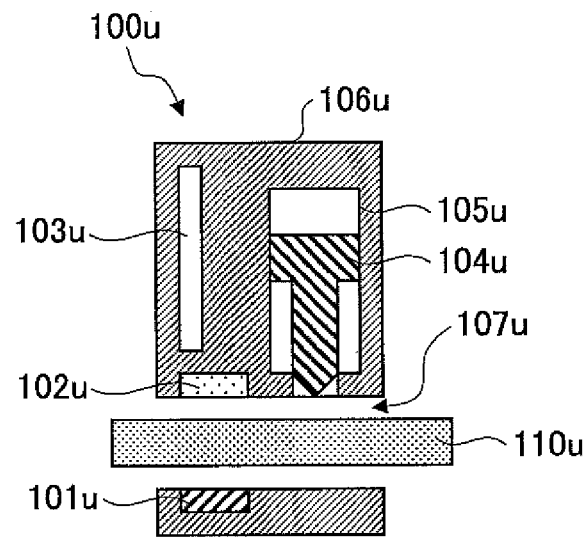
FIG. 3A is a schematic cross-sectional view showing one example of a structure of the current sensor according to the first embodiment.
Figure 3B:
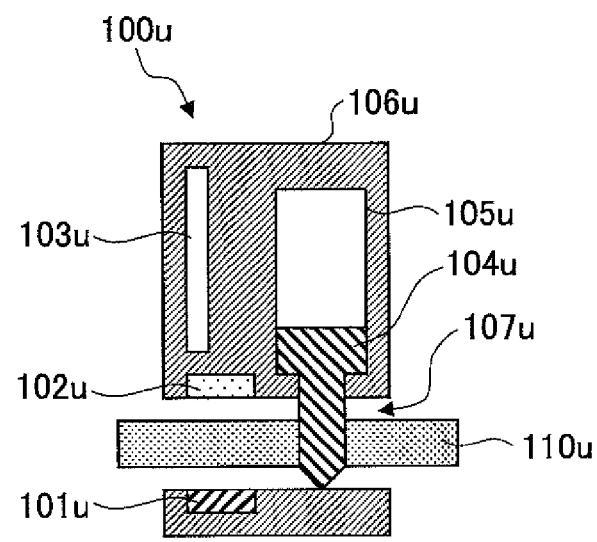
FIG. 3B is a schematic cross-sectional view showing the example of the structure of the current sensor according to the first embodiment.
Figure 3C:
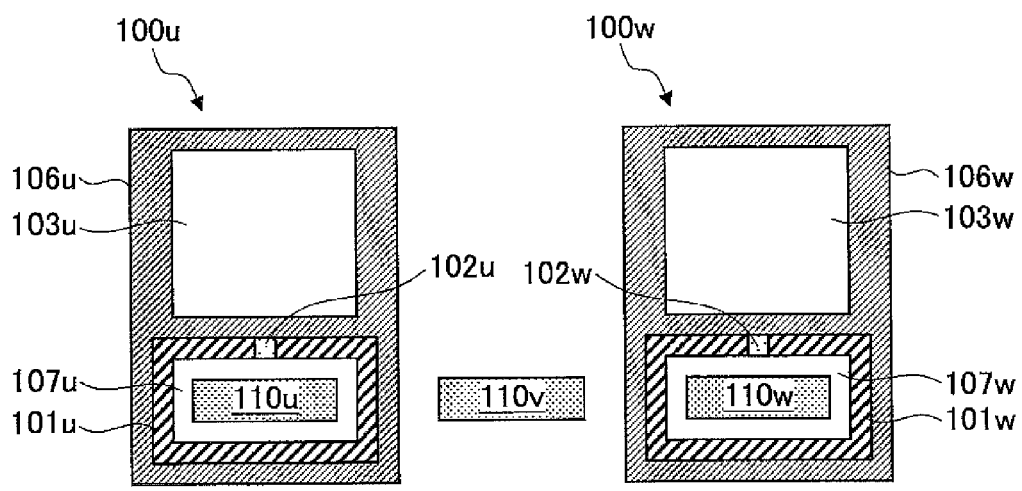
FIG. 3C is a schematic cross-sectional view showing the example of the structure of the current sensor according to the first embodiment.
Figure 3D:
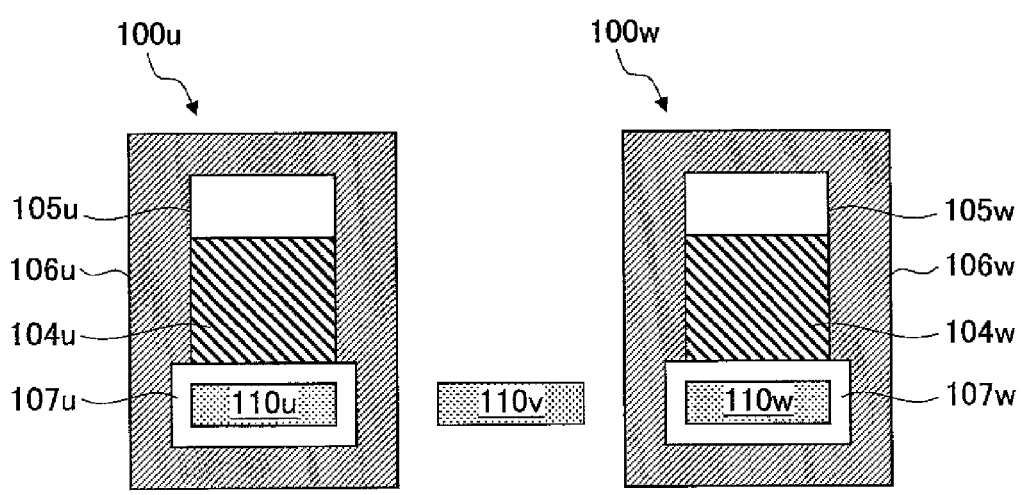
FIG. 3D is a schematic cross-sectional view showing the example of the structure of the current sensor according to the first embodiment.

FIGS. 3A-3D are schematic cross-sectional views showing the structures of the current sensors 100 (100u and 100w). The respective cross sections (an A-A cross section, a B-B cross section, and a C-C cross section) correspond to the respective cross section indications in FIG. 2. FIGS. 3A and 3B are the A-A cross-sectional views of the current sensor 100u, i.e., a cross-sectional view of the current sensor 100u in side view viewed from a direction perpendicular to the connecting wiring line 110u. FIG. 3A shows the A-A cross-sectional view of the current sensor 100u in a normal case (a case where no overcurrent flows through the connecting wiring line 110). FIG. 3B shows the A-A cross-sectional view of the current sensor 100u in a case where the disconnection mechanism is driven. FIG. 3C is the B-B cross-sectional view of the current sensors 100u and 100w, i.e., a cross-sectional view of the current sensors 100u and 100w in side view viewed from a direction parallel to the connecting wiring lines 110. FIG. 3D is the C-C cross-sectional view of the current sensors 100u and 100w, i.e., a cross-sectional view of a part including the disconnection mechanism of the current sensors 100u and 100w in side view viewed from a direction parallel to the connecting wiring lines 110. Note that, the structures of the current sensor 100u and the current sensor 100w are the same, and thus, description will be made focusing on the current sensor 100u.

As shown in FIGS. 3A-3O, the current sensor 100u includes a magnetic core 101u, a Hall device 102u, a circuit substrate 103u, a piston 104u, a cylinder 105u, a housing 106u, a through hole 107u, and so forth. The connecting wiring line 110u passes through the through hole 107u, and the current sensor 100u is arranged in such a manner as to surround the connecting wiring line 110u that is the bus bar.

As shown in FIGS. 3A-3C, the current sensor 100u is a current sensor of a non-contact type (a magnetic type). The current sensor 100u includes the magnetic core 101u, the Hall device 102u, the circuit substrate 103u, and so forth, as a current detection part. The magnetic core 101u, the Hall device 102u, and the circuit substrate 103u are housed in the housing 106u. The magnetic core 101u is arranged in such a manner as to surround the connecting wiring line 110u in cross section of the connecting wiring line 110u, and the Hall device 102u is inserted into a gap (a discontinuous part) formed in a circumferential direction of the magnetic core 101u. For the magnetic core 101u, a silicon steel plate, a dust core, a permalloy core, or the like, having high permeability and less residual magnetism, can be used.

A magnetic field generated due to a current flowing through the connecting wiring line 110u is applied to a magnetic sensitive surface of the Hall device 102u. Thus, the output of the Hall device 102u according to the current is acquired. From the output, the current flowing through the connecting wiring line 110u can be acquired. For example, in a case of a magnetic proportional current sensor, the intensity of the magnetic field applied to the magnetic sensitive surface of the Hall device 102u is proportion to the to be measured current. Therefore, it is possible to acquire the current flowing through the connecting wiring line 110u from the output voltage of the Hall device 102u. In a case of a magnetic balance current sensor, a feedback current is supplied from the Hall device 102u to a feedback coil (formed from installing a winding in the magnetic core 101u) in such a manner as to cancel out the magnetic field generated by the to be measured current, and it is possible to acquire the current flowing through the connecting wiring line 110u from the feedback current.

The circuit substrate 103u has an output circuit (a current detection circuit) provided to output the output of the Hall device 102u as the output signal according to the current flowing through the connecting wiring line 110u. For example, in the case of the magnetic proportional current sensor, an amplifier circuit for amplifying and outputting the output voltage of the Hall device 102u, and so forth, can be included in the output circuit. In the case of the magnetic balance current sensor, the output circuit can have a detection resistor to output the feedback current supplied by the Hall device 102u as a voltage, an amplifier circuit amplifying and outputting the voltage across the two ends of the detection resistor, and so forth. Note that, the circuit substrate 103u can include also a power source for deriving the current sensor 100u, and so forth.

Further, as shown in FIGS. 3A, 3B, and 3D, the piston 104u is installed slidable in the cylinder 105u as the disconnection mechanism. The disconnection mechanism (the piston 104u and the cylinder 105u) is housed in the same housing 106u where the current detection part (the magnetic core 101u, the Hall device 102u, the circuit substrate 103u, and so forth) are housed. As shown in FIG. 3B, as a result of the piston 104u being driven and projecting downward, it presses the connecting wiring line 110u to break it, and thus, the piston 104u is capable of disconnecting the connecting wiring line 110u. The extending end (the part pressing the connecting wiring line 110u) of the piston 104u that is a pressing member can have, as shown in FIGS. 3A and 3B, a pointed shape, and therewith, it is possible to positively break the connecting wiring line 110u. Because the connecting wiring line 110u is the bus bar, bending thereof due to the pressing force by the projecting piston 104u is less, and thus, it is possible to more positively disconnect the connecting wiring line 110u. Near a part of the connecting wiring line 110u at which the piston 104u is pressed, the magnetic core 101u is arranged in such a manner as to surround the bus bar in cross section of the bus bar. Thereby, the magnetic core 101u and the housing 106u holding the magnetic core 101u support, from the bottom, part of the connecting wiring line 110u near the part pressed by the piston 104u. Thus, it is possible to more positively disconnect the connecting wiring line 110u.

At least the part of the piston 104u pressing the connecting wiring line 110u and the part of the piston 104u that may be in contact with the connecting wiring line 110u are made of (electrically) insulated members. For example, it is possible to form a basic shape with a metal and coat its surface with an insulated member such as a resin to form the piston 104u, or it is also possible to form the entirety of the piston 104u with an insulating member such as ceramics.

The piston 104u can be such as to project downward in a so-called pyro method, for example. Actually, an igniter (not shown) is operated, thus gunpowder is ignited, and the gunpowder is used to ignite a gas generation agent or the like. Thus, a high-pressure combustion product (a flame, a high pressure gas, a shock wave, or the like) is generated. The generated combustion product flows into the cylinder 105u, thus the piston 104u moves axially, and the piston 104u projects. The circuit (the drive circuit) driving the disconnection mechanism (outputting an ignition signal to the igniter) is installed on the same circuit substrate 103u where the output circuit is installed. The drive circuit outputs the ignition signal to the igniter according to the driving signal that drives the disconnection mechanism transmitted by the MG-ECU 50. Thus, as a result of using explosive force of the gunpowder as a driving force of the piston 104u, it is possible to disconnect the connecting wiring line 110u immediately in response to a detection of an overcurrent. Note that, as the driving method of the piston 104u, it is also possible to use a method other than the above-mentioned method using gunpowder. For example, it is also possible to use a method with electromagnetic force, motive power of pneumatic pressure, hydraulic pressure, or the like.

Thus, by placing the current detection part as an overcurrent detecting means and the disconnection mechanism disconnecting the wiring line when an overcurrent is detected in the same housing, it is possible to improve the space efficiency in comparison to a case where the current sensor and the disconnection mechanism are separately installed. In other words, it is possible to reduce the space required for the current detection part and the disconnection mechanism, and thus, for example, it is not necessary to increase the lengths of the connecting wiring lines 110u, 110v, and 110w, or the like. Further, it is possible to improve the space efficiency and reduce the cost by installing the current detection circuits (for example, the output circuits and so forth) and the drive circuits (for example, the circuits outputting the ignition signals to the igniters) driving the disconnection mechanisms of the current sensors on the same substrates, and placing them in the same housings.

For controlling the MG 40 (feedback control), the current sensors detecting the currents of the two phases from among the three phases of the connecting wiring lines 110u, 110v, and 110w are needed. Therefore, by substituting the current sensors to be used to control the MG 40 with the above-described current sensors where the current detection parts and the disconnection mechanisms are placed in the same housings described above, it is possible to minimize the increase in the space and the cost required to add the disconnection mechanisms.

Note that, in the present embodiment, the current sensors 100 are the magnetic-type current sensors using the Hall devices. However, also another type of the current detection parts can be used. For example, the current detection parts can be those using shunt resistors. Also in this case, it is possible to improve the space efficiency by placing the current detection parts and the disconnection mechanisms in the same housings in the same way. Further, it is possible to improve the space efficiency and reduce the cost by installing the current detection circuits including circuits outputting the voltages across the shunt resistors and so forth and the drive circuits driving the disconnection mechanisms on the same substrates, and placing them in the same housings.

Next, operations of the MG-ECU 50 when an overcurrent is detected will be described.

The MG-ECU 50 calculates the current values of the connecting wiring lines 110u, 110v, and 110w based on the output signals from the current sensors 100u and 100w, and determines whether an overcurrent is flowing. A determination as to whether an overcurrent flows can be made by a determination as to whether a range of the current value in the normal case is exceeded, whether a discrepancy occurs from the current waveform (AC waveform) in the normal case, or the like. Note that, the MG-ECU 50 can be such as to be able to calculate the current values of the connecting wiring lines 110u, 110v, and 110w based on the predetermined output characteristics of the current sensors 100u and 100w by storing them in an internal RAM or the like, for example.

If the MG-ECU 50 determines that any one of the connecting wiring lines 110u, 110v, and 110w has an overcurrent flowing through, the MG-ECU 50 transmits the driving signal to the respective drive circuits included in the circuit substrates 103u and 103w of the current sensors 100u and 100w.

The respective drive circuits of the current sensors 100u and 100w drive the disconnection mechanisms (the pistons 104u and 104w) based on the driving signals, and thus, break and disconnect the connecting wiring lines 110u and 110w.

For example, if a short-circuit failure occurs in any one of the transistors SW21 through SW26 included in the inverter 20, a short circuit is formed by the transistor having the short-circuit failure and the MG 40 because the transistors SW21 through SW26 have the diodes D21 through D26 installed in parallel. Because the inverter 20 and the MG 40 are connected by the three connecting wiring lines 110u, 110v, and 110w, the two short circuits are formed. The two short circuits are constantly in electrically conductive states. Thus, if the MG 40 generates power, the currents flow through the two short circuits, and thus, an overcurrent flows between the inverter 20 and the MG 40.

It is possible to electrically separate the inverter 20 (the power conversion apparatus 2) and the MG 40 by disconnecting the two connecting wiring lines 110u and 110w with the disconnection mechanisms (the pistons 104u and 104w) installed in the two current sensors 100u and 100w. Thereby, it is possible to avoid a failure in the MG 40, abnormal heat generation in the circuit, or the like, due to the overcurrent continuously flowing.

[Second Embodiment]

Next, the second embodiment will be described.

The current sensor 100 according to the present embodiment is different from the first embodiment in that the current detection parts detecting the currents of the two connecting wiring lines 110u and 110v of the U-phase and the V-phase, and the disconnection mechanism disconnecting the two connecting wiring lines 110u and 110v are housed (integrated) in the same housing. Below, the same reference numerals are given to the same elements as those of the first embodiment, and description will be made focusing on the different parts.

The system configuration of the vehicle 1 including the current sensor 100, and the power conversion apparatus 2 according to the present embodiment is the same as FIG. 1 concerning the first embodiment except for the arrangement of the current sensor 100. Thus, the description thereof will be omitted.

Below, the current sensor 100 according to the present embodiment will be described in detail.

Figure 4:
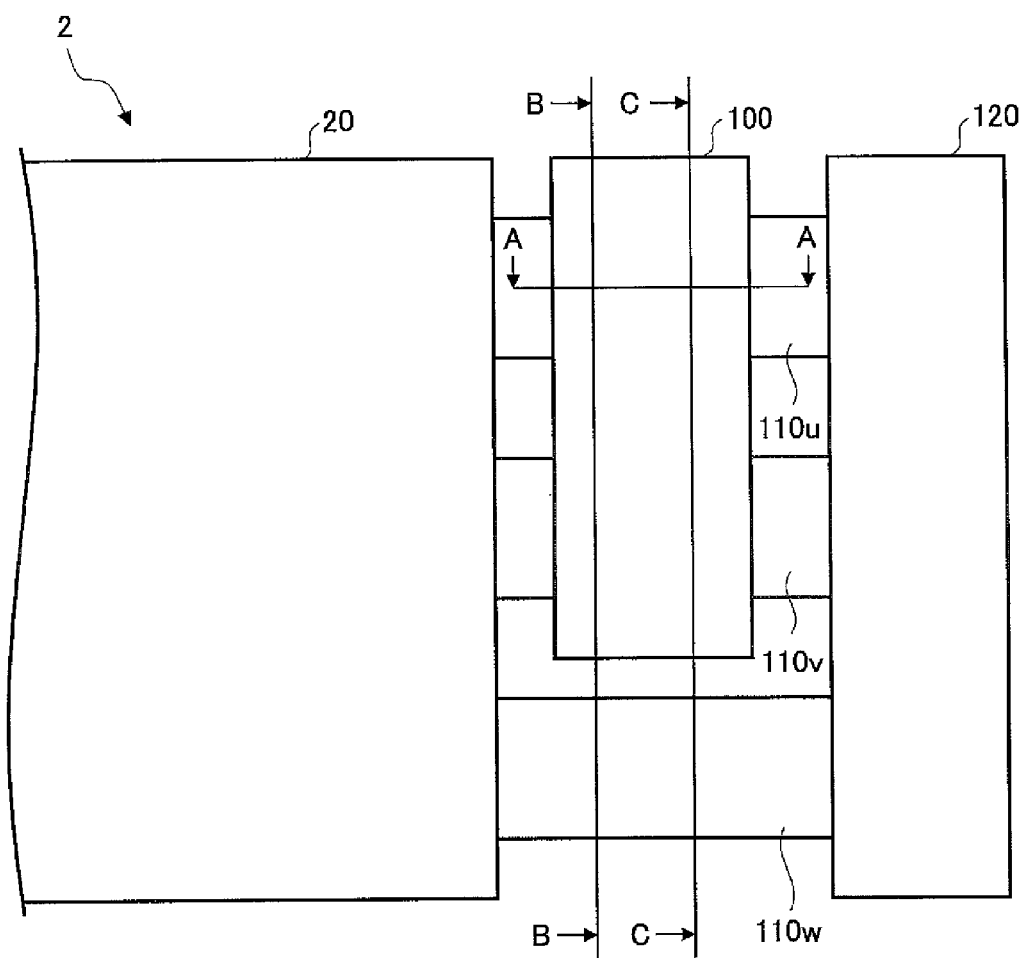
FIG. 4 shows one example of an arrangement of a current sensor according to a second embodiment.

FIG. 4 shows the arrangement of the current sensor 100 according to the present embodiment. FIG. 4 shows the output part of the power conversion apparatus 2 in plan view. Between the inverter 20 and the output terminal 120, the connecting wiring line 110u of the U-phase, the connecting wiring line 110v of the V-phase, and the connecting wiring line 110w of the W-phase, in three-phase alternating currents, are installed. Note that, the output terminal 120 is a terminal to be connected with a wiring harness (not shown) to be connected with the MG 40.

The current sensor 100 detects the currents of the connecting wiring lines 110u and 110v connected to the U-phase and the V-phase of the MG 40, from among the connecting wiring lines 110 (110u, 110v, and 110w) connected from the inverter 20 to the MG 40. The output signals of the current sensor 100 are input to the MG-ECU 50, and are used to control the MG 40 (feedback control). Based on the output signals of the current sensor 100, the MG-ECU 50 determines whether an overcurrent is flowing through the connecting wiring lines 110 (110u, 110v, and 110w).

The current sensor 100 has the disconnection mechanism in the same housing. The disconnection mechanism is installed to disconnect the wiring lines for which the current sensor 100 detects the currents. Although details will be described later, the current sensor 100 has the drive circuit driving the disconnection mechanism. As a result of the MG-ECU 50 determining that an overcurrent flows transmitting the driving signal to the drive circuit, the disconnection mechanism is driven.

Figure 5A:
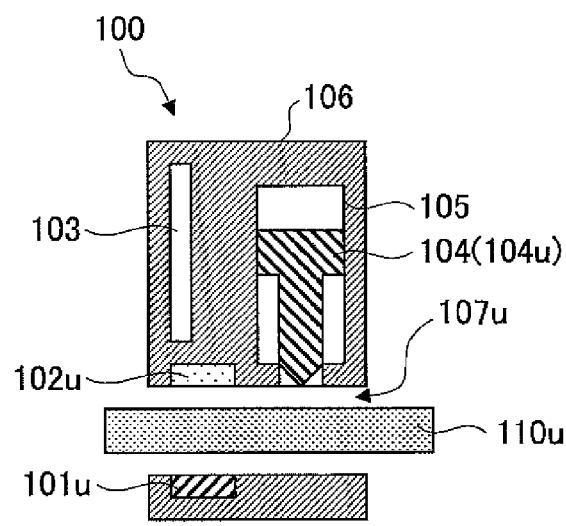
FIG. 5A is a schematic cross-sectional view showing one example of a structure of the current sensor according to the second embodiment.
Figure 5B:
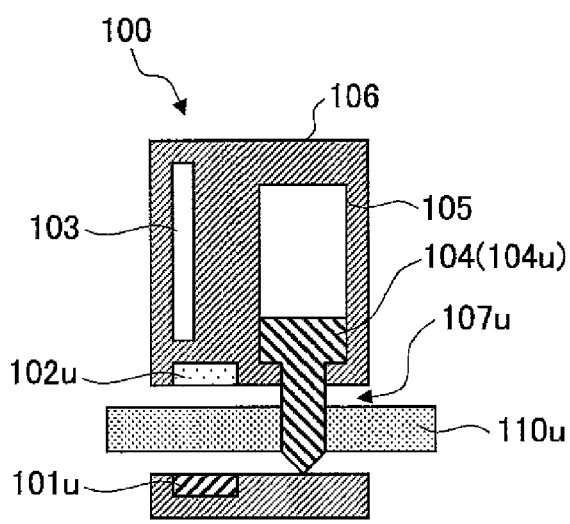
FIG. 5B is a schematic cross-sectional view showing the example of the structure of the current sensor according to the second embodiment.
Figure 5C:
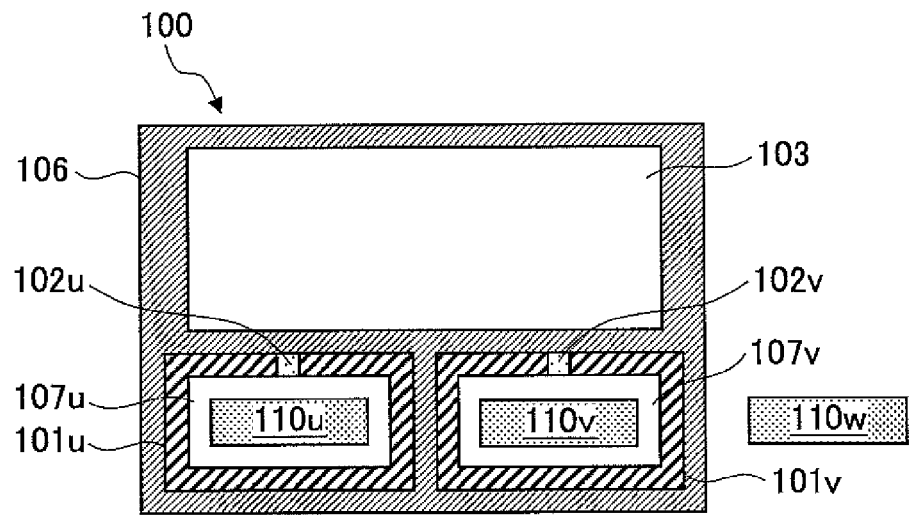
FIG. 5C is a schematic cross-sectional view showing the example of the structure of the current sensor according to the second embodiment.
Figure 5D:
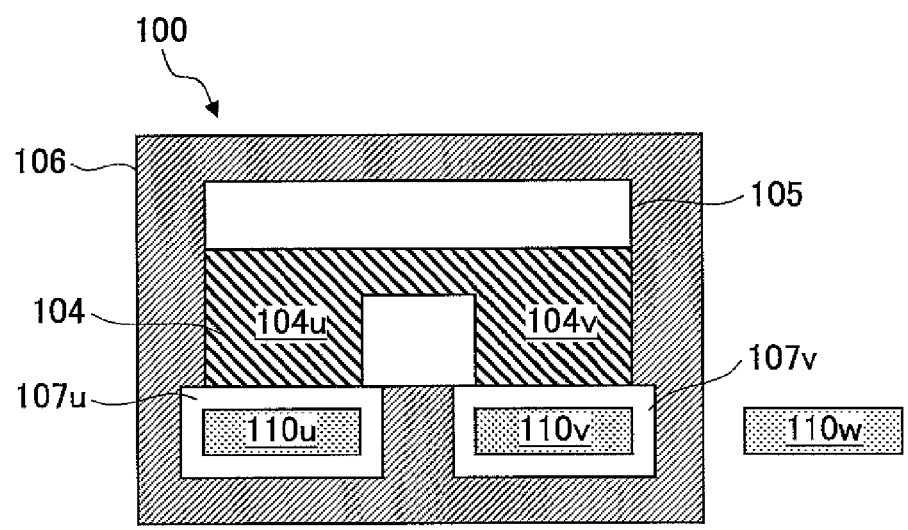
FIG. 5D is a schematic cross-sectional view showing the example of the structure of the current sensor according to the second embodiment.

FIGS. 5A-5D are schematic cross-sectional views showing the structure of the current sensor 100. The respective cross sections (the A-A cross section, the B-B cross section, and the C-C cross section) correspond to the respective cross section indications in FIG. 4. FIGS. 5A and 5B are the A-A cross-sectional views of the current sensor 100, i.e., cross-sectional views of the current sensor 100 in side view viewed from a direction perpendicular to the connecting wiring lines 110. Note that, FIGS. 5A and 5B are the cross-sectional views of a part where the current detection part detecting the current of the connecting wiring line 110u and the disconnection mechanism disconnecting the connecting wiring line 110u are placed. However, the cross-sectional views of a part where the current detection part detecting the current of the connecting wiring line 110v and the disconnection mechanism disconnecting the connecting wiring line 110v are placed can also be expressed in the same way as FIGS. 5A and 5B. FIG. 5A shows the A-A cross-sectional view of the current sensor 100 in the normal case (in the case where no overcurrent flows through the connecting wiring lines 110). FIG. 5B shows the A-A cross-sectional view of the current sensor 100 in the case where the disconnection mechanism is driven. FIG. 5C shows the B-B cross-sectional view of the current sensor 100, i.e., a cross-sectional view of the current sensor 100 in side view viewed from a direction parallel to the connecting wiring line 110. FIG. 5D is the C-C cross-sectional view of the current sensor 100, i.e., a cross-sectional view of a part including the disconnection mechanism of the current sensor 100 in side view viewed from the direction parallel to the connecting wiring lines 110.

As shown in FIGS. 5A-5D, concerning the connecting wiring line 110u, the current sensor 100 includes the magnetic core 101u, the Hall device 102u, the circuit substrate 103, the piston 104u, the cylinder 105, the housing 106, the through hole 107u, and so forth. Concerning the connecting wiring line 110v, the current sensor 100 includes the magnetic core 101v, the Hall device 102v, the circuit substrate 103, the piston 104v, the cylinder 105, the housing 106, the through hole 107v, and so forth. The connecting wiring lines 110u and 110v pass through the through holes 107u and 107v, respectively, and the current sensor 101 is arranged in such a manner as to surround the connecting wiring lines 110u and 110v that are the bus bars.

As shown in FIGS. 5A-5C, the current sensor 100 is, in the same way as that in the first embodiment, a non-contact-type (magnetic-type) current sensor, and, includes the magnetic core 101u, the Hall device 102u, the circuit substrate 103, and so forth, as the current detection part for the connecting wiring line 110u. Also, the current sensor 100 can be such as to include the magnetic core 101v, the Hall device 102v, the circuit substrate 103, and so forth, as the current detection part of the connecting wiring line 110v. The current detection part (the magnetic core 101u and the Hall device 102u) for the connecting wiring line 110u, and the current detection part (the magnetic core 101v and the Hall device 102v) for the connecting wiring line 110v are, in the same way as the connecting wiring lines 110u and 110v, placed in parallel. The magnetic cores 101u, 101v, the Hall devices 102u, 102v, and the circuit substrate 103 are housed in the same housing 106. Note that, the structure of the magnetic core 101v, the Hall device 102v, and so forth, as the current detection part for the connecting wiring line 110v is the same as the structure of the magnetic core 101u, the Hall device 102u, and so forth, as the current detection part for the connecting wiring line 110u. Therefore, below, description will be made focusing on the current detection part for the connecting wiring line 110u.

The magnetic core 101u is arranged in such a manner as to surround the connecting wiring line 110u in cross section of the connecting wiring line 110u, and the Hall device 102u is inserted in a gap (discontinuous part) formed in a circumferential direction of the magnetic core 101u, in the same way as the first embodiment.

In the same way as the first embodiment, as a result of the magnetic field generated by the current flowing through the connecting wiring line 110u being applied to the magnetic sensitive surface of the Hall device 102u, the output according to the current is acquired from the Hall device 102u, and it is possible to acquire the current flowing through the connecting wiring line 110u from the output.

On the circuit substrate 103, the output circuit (the current detection circuit) is installed which, in the same way as the first embodiment, outputs the output of the Hall device 102u as the output signal according to the current flowing through the connecting wiring line 110u. Also, on the circuit substrate 103, the output circuit (the current detection circuit) is installed which outputs the output of the Hall device 102v as the output signal according to the current flowing through the connecting wiring line 110v. Note that, the circuit substrate 103 can be such as to also include, in the same way as the first embodiment, the power source driving the current sensor 100, and so forth.

As shown in FIGS. 5A, 5B, and 5D, as the disconnection mechanism for the connecting wiring lines 110$u$ and 110$v$, the piston 104 is installed slidable in the cylinder 105. The piston 104 includes the piston 104$u$ pressing and disconnecting the connecting wiring line 110$u$, and the piston 104$v$ pressing and disconnecting the connecting wiring line 110$v$. The pistons 104$u$ and 104$v$ have a one-piece structure, and the pistons 104$u$ and 104$v$ operate as one piece. The disconnection mechanism (the piston 104 and the cylinder 105) is housed in the same housing 106 where the current detection parts (the magnetic cores 101$u$, 101$v$, the Hall devices 102$u$, 102$v$, the circuit substrate 103$u$, and so forth) are housed.

As shown in FIG. 5B, in the same way as the first embodiment, as a result of the piston 104 (104$u$) being driven and projecting downward, it is possible to press and break the connecting wiring line 110$u$, and disconnect the connecting wiring line 110$u$ therewith. As a result of also the piston 104$v$ projecting downward, it is possible to press and break the connecting wiring line 110$v$, and disconnect the connecting wiring line 110$v$ therewith, in the same way. Details such as the actual structure of the piston 104, the driving method, and so forth, are the same as those of the first embodiment except that the pistons 104$u$ and 104$v$ have the one-piece structure and operate as one piece. Therefore, the descripting thereof will be omitted.

Thus, in the same way as the first embodiment, the current detection parts as the overcurrent detecting means and the disconnection mechanism disconnecting the wiring lines when an overcurrent is detected are placed in the same housing. Thereby, it is possible to improve the space efficiency in comparison to a case where the current sensor and the disconnection mechanism are installed separately. In other words, it is possible to reduce the space required for the current detection parts and the disconnection mechanism, and thus, for example, it is not necessary to increase the lengths of the connecting wiring lines 110$u$, 110$v$, and 110$w$, or the like. Further, the current detection circuits (for example, the output circuits, and so forth) of the current sensor 100 (100$u$, 100$v$) and the drive circuit (for example, the circuit outputting the ignition signal to the igniter) driving the disconnection mechanism are installed on the same substrate, and are placed in the same housing. Thereby, it is possible to improve the space efficiency and reduce the cost.

For controlling the MG 40 (feedback control), the current sensor detecting the currents for two phases from among the three phases of the connecting wiring lines 110$u$, 110$v$, and 110$w$ are needed. Therefore, by housing (integrating) the current detection parts detecting the respective currents of the adjacent connecting wiring lines 110$u$ and 110$v$ of the U-phase and the V-phase in the same housing, it is possible to reduce the space required for the current sensor. As a result, it is also possible to integrate the disconnection mechanism for disconnecting the connecting wiring lines 110$u$ and 110$v$ (uniting the pistons disconnecting the connecting wiring lines 110$u$ and 110$v$ into one piece). Thus, it is possible to further reduce the space required to add the disconnection mechanism. Also, by thus integrating the disconnection mechanism, it is possible to integrate the circuit driving the disconnection mechanism. Thus, it is possible to further reduce the space and the cost required to add the disconnection mechanism.

Note that, in the present embodiment, the current sensor 100 is the magnetic current sensor using the Hall device. However, as the current detection parts, another type of a current sensor can be used in the same way as the first embodiment. Further, the current sensor 100 described above is such that the currents in the connecting wiring lines 110$u$ and 110$v$ of the U-phase and the V-phase are detected, and the connecting wiring lines 110$u$ and 110$v$ are disconnected. However, the current sensor can be also such that the currents in the adjacent connecting wiring lines 110$v$ and 110$w$ of the V-phase and the W-phase are detected, and the connecting wiring lines 110$v$ and 110$w$ are disconnected.

Next, operations of the MG-ECU 50 if an overcurrent is detected will be descried.

The MG-ECU 50 calculates the current values of the connecting wiring lines 110$u$, 110$v$, and 110 based on the output signals from the current sensor 100, and determines whether an overcurrent is flowing there.

If determining that an overcurrent is flowing through any one of the connecting wiring lines 110$u$, 110$v$, and 110$w$, the MG-ECU 50 transmits the driving signal to the drive circuit included in the circuit substrate 103 of the current sensor 100.

The drive circuit of the current sensor 100 drives the disconnection mechanism (the piston 104) based on the driving signal, and breaks and disconnects the connecting wiring lines 110$u$ and 110$v$.

Therefore, in the same way as the first embodiment, it is possible to disconnect the two connecting wiring lines 110$u$ and 110$v$, and electrically separate between the inverter 20 (the power conversion apparatus 2) and the MG 40. Thereby, it is possible to avoid a failure in the MG 40, abnormal heat generation in the circuit, and so forth, occurring due to an overcurrent continuously flowing.

[Third Embodiment]

Next, the third embodiment will be described.

The current sensor 100 according to the present embodiment is such that, in the same way as the second embodiment, the current detection parts and the disconnection mechanism for two phases, from among the connecting wiring lines of three-phase alternating currents from the power conversion apparatus 2 to the MG 40, are integrated. What is different from the second embodiment is that the power conversion apparatus 2 according to the present embodiment supplies three-phase AC power to two MGs 40 (a MG 40$a$ and a MG 40$b$), and the current sensor according to the present embodiment further integrates the current detection parts and the disconnection mechanism for two phases of each set of the connecting wiring lines of the two sets of three-phase alternating currents. Below, the same reference numerals are given to the elements the same as those of the first and second embodiments, and description will be made focusing on the different points.

Figure 6:
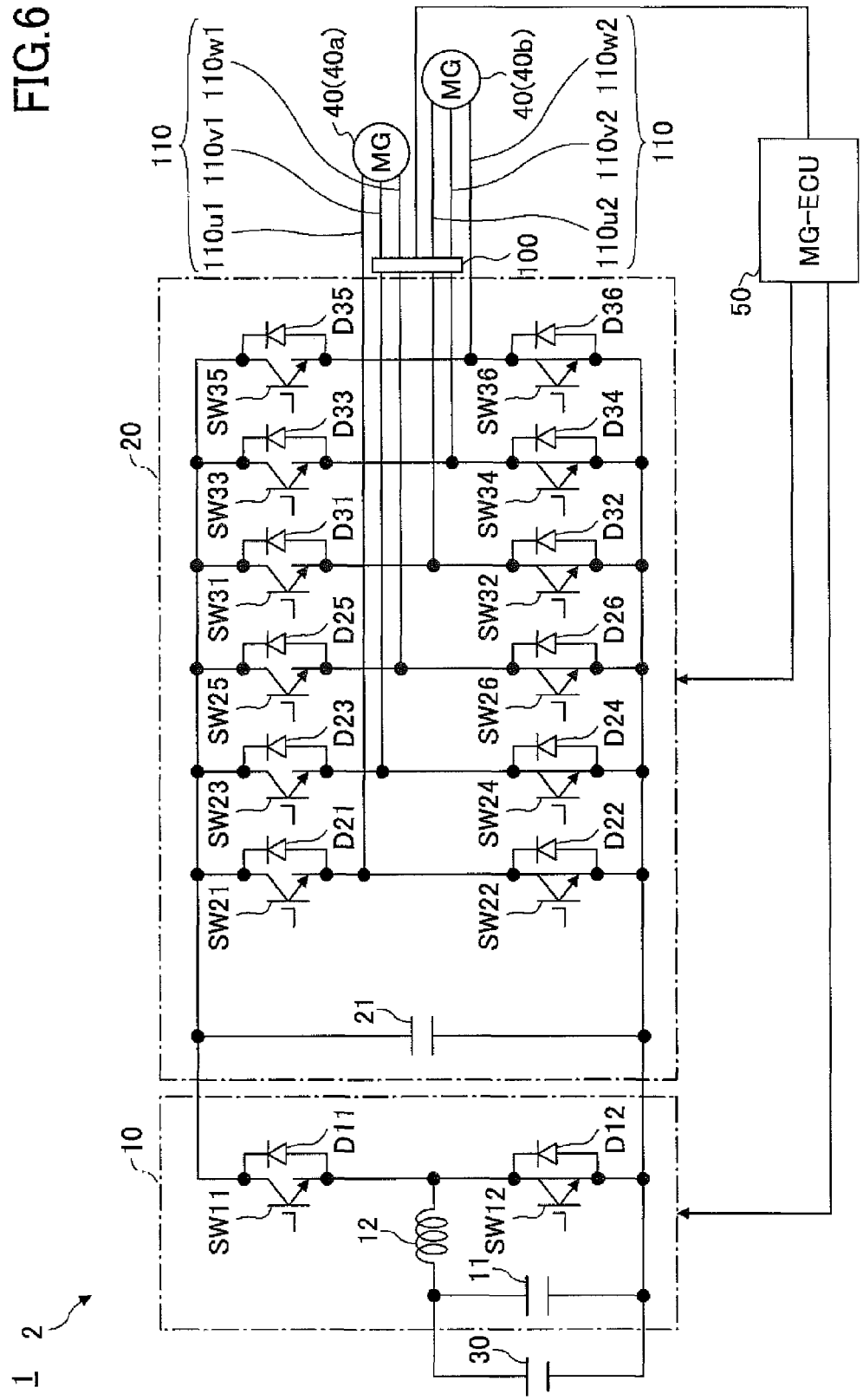
FIG. 6 is a system configuration diagram of a vehicle including a current sensor, and a power conversion apparatus according to a third embodiment.

FIG. 6 is a block diagram showing a system configuration of a vehicle 1 including a current sensor 100, and a power conversion apparatus 2 according to the present embodiment. Note that, description will be made focusing on the different parts from the first and second embodiments.

The vehicle 1 is an electric vehicle having an electric motor as a drive source. Note that the vehicle 1 can be a hybrid vehicle in which also an engine is installed, or can be an electric motor car using only the electric motor as the drive source.

The vehicle 1 includes a battery 30, motor generators (hereinafter, referred to as MGs) 40, the power conversion apparatus 2, a MG-ECU 50, the current sensor 100, and so forth.

The battery 30 is an electric storage device supplying power to the MGs 40. Because the battery 30 is the same as those of the first and second embodiments, the description will be omitted.

The MGs 40 are rotating electric motors as drive sources of the vehicle 1, and are also generators. The MGs 40 include MGs 40a and 40b. For example, the MG 40a can be such that the MG 40a drives the vehicle 1 with power supplied by the battery 30, and, when the vehicle 1 is decelerated, the MG 40a functions as a generator by carrying out a regeneration operation, and charges the battery 30 with the generated power. If the vehicle 1 is a hybrid vehicle, the MG 40b can be such that the MG 40b drives an internal-combustion engine (not shown) in an assisting manner to start the internal-combustion engine with power supplied by the battery 30, and is driven by the internal-combustion engine to generate power. Note that, the generated power can be supplied to another rotating electric motor installed in the vehicle 1, used to charge the battery 30, or the like. The MGs 40a and 40b are driven by three-phase AC power supplied via an inverter 20 included in the power conversion apparatus 2 described later.

The power conversion apparatus 2 is a drive apparatus for driving the MGs 40 with power supplied by the battery 30, and includes a step-up converter 10 and the inverter 20.

The step-up converter 10 increases the voltage of the battery 30 up to a predetermined voltage (the voltage driving the MGs 40). Because the battery 30 is the same as those of the first and second embodiments, the description will be omitted.

The inverter 20 converts the DC power supplied by the battery 30 via the step-up converter 10 into three-phase AC power, and supplies the power to the MGs 40a and 40b. The inverter 20 includes transistors SW21 (upper arm) and SW22 (lower arm) for a U-phase, transistors SW23 (upper arm) and SW24 (lower arm) for a V-phase, and transistors SW25 (upper arm) and SW26 (lower arm) for a W-phase, as part to supply three-phase AC power to the MG 40a. The inverter 20 also includes transistors SW31 (upper arm) and SW32 (lower arm) for a U-phase, transistors SW33 (upper arm) and SW34 (lower arm) for a V-phase, and transistors SW35 (upper arm) and SW36 (lower arm) for a W-phase, as part to supply three-phase AC power to the MG 40b. The inverter 20 is capable of converting the DC power into the three-phase AC power as a result of the MG-ECU 50 described later carrying out switching control of the transistors SW21-SW26 and the transistors SW31-SW36, and supplying the power to the MGs 40a and 40b. Note that, the inverter 20 includes a drive circuit (not shown) for the transistors SW21-SW26 and the transistors SW31-SW36, and the switching control by the MG-ECU 50 is carried out via the drive circuit.

The MG-ECU 50 is a control unit carrying out driving control of the MGs 40. The MG-ECU 50 implements various processes such as control of the step-up converter 10, described later, control of the MGs 40 (the MGs 40a and 40b) via the inverter 20, driving control of the disconnection mechanism of the current sensor 100, and so forth, in the same way as the first and second embodiments, by executing the various control programs on the CPU.

The MG-ECU 50 controls the step-up operation of the step-up converter 10. Because the control of the step-up operation is the same as those of the first and second embodiments, the description will be omitted.

The MG-ECU 50 receives torque commands that are calculated by an integrated control ECU (not shown) of the vehicle 1 based on an amount of an accelerator operation made by the driver, the state of the battery 30, the vehicle states, and so forth, and controls the MGs 40a and 40b via the inverter 20 in such a manner that the torques according to the torque commands will be output. Actually, the MG-ECU 50 can be such as to control the MG 40a in a feedback control manner based on signals from a rotational speed sensor installed at the MG 40a, the current sensor 100 installed at the connecting wiring lines 110 (110v1 and 110w1) connected to the coils of the V-phase and the W-phase of the MG 40a, and so forth. Also, the MG 50-ECU can be such as to control the MG 40b in a feedback control manner based on signals from a rotational speed sensor installed at the MG 40b, the current sensor 100 installed at the connecting wiring lines 110 (110u2 and 110v2) connected to the coils of the U-phase and the V-phase of the MG 40b, and so forth. The MG-ECU 50 calculates the duty ratios of the transistors SW21 through SW26 and SW31 through SW36, and so forth, and outputs PWM signals to the inverter 20 (the drive circuit).

The MG-ECU 50 determines whether an overcurrent flows through the connecting wiring lines 110 (110u1, 110v1, 110w1, 110u2, 110v2, and 110w2) based on the output signals from the current sensor 100. If determining that an overcurrent is flowing, the MG-ECU 50 transmits the driving signal to drive the disconnection mechanism described later to the drive circuit, and disconnects the connecting wiring lines 110 (110v1, 110w1, 110u2 and 110v2). The disconnection process of the connecting wiring lines 110 when an overcurrent flows will be described later in detail.

The current sensor 100 detects the currents of the connecting wiring lines 110v1 and 110w1 connected to the V-phase and the W-phase of the MG 40a from among the connecting wiring lines 110 connected from the inverter 20 to the MG 40a. The current sensor 100 also detects the currents of the connecting wiring lines 110u2 and 110v2 connected to the U-phase and the V-phase of the MG 40b from among the connecting wiring lines 110 connected from the inverter 20 to the MG 40b. The output signals of the current sensor are, as described above, input to the MG-ECU 50, and are used to control the MGs 40 (the MGs 40a and 40b) (feedback control). Also, as described above, based on the output signals of the current sensor 100, the MG-ECU 50 determines whether an overcurrent flows through the connecting wiring lines 110 (110u1, 110v1, 110w1, 110u2, 110v2, and 110w2). Note that, the MG-ECU 50 is capable of calculating the current value of the connecting wiring line 110u1 from the current values of the connecting wiring lines 110v1 and 110w1 based on the output signals of the current sensors 100. Also, the MG-ECU 50 is capable of calculating the current value of the connecting wiring line 110w2 from the current values of the connecting wiring lines 110u2 and 110v2 based on the output signals of the current sensor 100.

The current sensor 100 includes the disconnection mechanism in the same housing, in the same way as the first and second embodiments. The disconnection mechanism is provided to disconnect the wiring lines for which the current sensor 100 detects the currents. Although details will be described later, the current sensor 100 has the drive circuit to drive the disconnection mechanism, and the disconnection mechanism is driven as a result of the MG-ECU 50 that determines that an overcurrent flows transmitting the driving signal to the drive circuit.

Below, the current sensor 100 according to the present embodiment will be described in detail.

Figure 7:
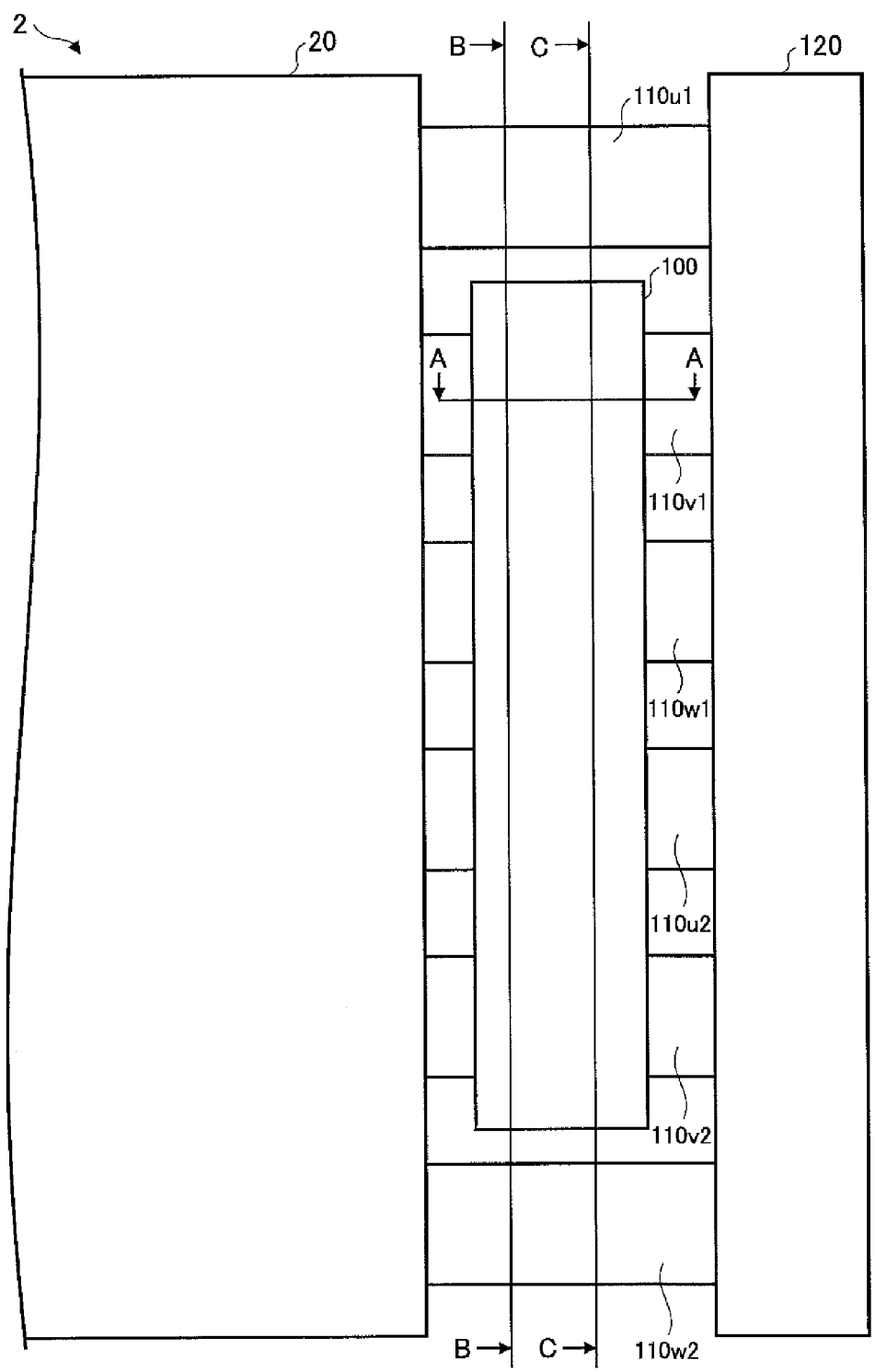
FIG. 7 shows one example of an arrangement of a current sensor according to the third embodiment.

FIG. 7 shows one example of an arrangement of the current sensor 100 according to the present embodiment. FIG. 7 shows an output part of the power conversion apparatus 2 in plan view. Between the inverter 20 and an output terminal 120, the connecting wiring line 110u of the U-phase, the connecting wiring line 110v of the V-phase, and the connecting wiring line 110w of the W-phase for the MG 40a are installed. Also, parallel to the connecting wiring lines 110u1, 110v1, and 110w1 for the MG 40a, the connecting wiring line 110u of the U-phase, the connecting wiring line 110v of the V-phase, and the connecting wiring line 110w of the W-phase for the MG 40b are installed. Note that, the output terminal 120 is a terminal to be connected to a wiring harnesses (not shown) to be respectively connected to the MGs 40a and 40b.

As shown in FIG. 7, the connecting wiring lines 110 (110u1, 110v1, 110w1, 110u2, 110v2, and 110w2) are bus bars made of electrically conductive plates. The current sensor 100 is arranged in such a manner as to surround the connecting wiring lines 110v1 and 110w1 of the V-phase and the W-phase for the MG 40a, and the connecting wiring lines 110u2 and 110v2 of the U-phase and the V-phase for the MG 40b.

Figure 8A:
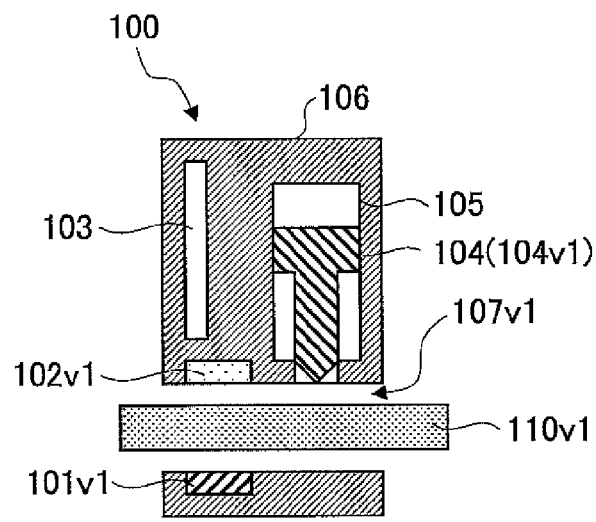
FIG. 8A is a schematic view showing one example of a structure of the current sensor according to the third embodiment.
Figure 8B:
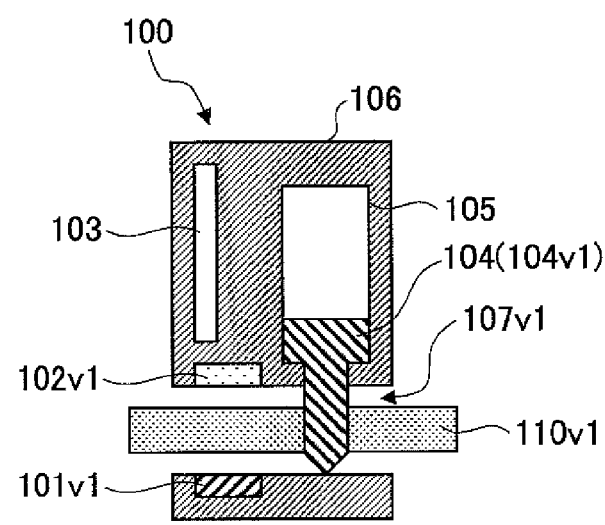
FIG. 8B is a schematic view showing the example of the structure of the current sensor according to the third embodiment.
Figure 8D:
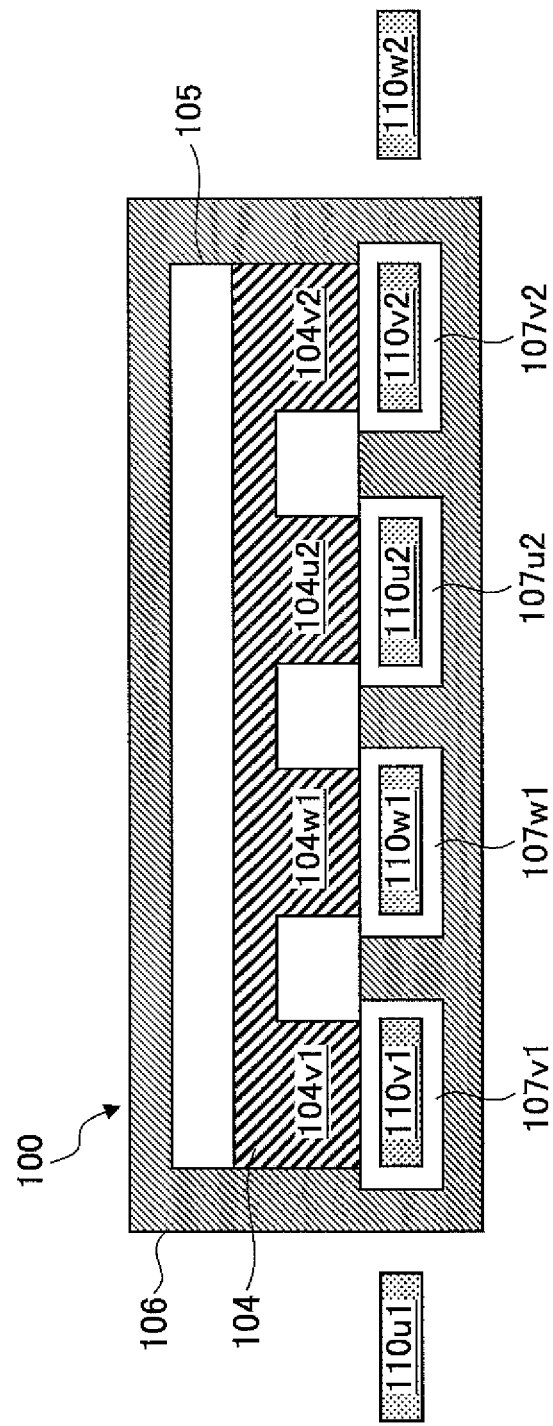
FIG. 8D is a schematic view showing the example of the structure of the current sensor according to the third embodiment.

FIGS. 8A-8D are schematic cross-sectional views showing the structures of the current sensor 100. The respective cross sections (an A-A cross section, a B-B cross section, and a C-C cross section) correspond to the respective cross section indications in FIG. 7. FIGS. 8A and 8B are the A-A cross-sectional views of the current sensor 100, i.e., cross-sectional views of the current sensor 100 in side view viewed from a direction perpendicular to the connecting wiring lines 110. Note that, FIGS. 8A and 8B are the cross-sectional views of a part where the current detection part detecting the current of the connecting wiring line 110v1 and the disconnection mechanism disconnecting the connecting wiring line 110v1 are placed. However, the cross-sectional views of a part where the current detection part detecting the current of the connecting wiring line 110w1 and the disconnection mechanism disconnecting the connecting wiring line 110w1 are placed can also be expressed in the same way as in FIGS. 8A and 8B. Also, the cross-sectional views of a part where the current detection part detecting the current of the connecting wiring line 110u2 and the disconnection mechanism disconnecting the connecting wiring line 110u2 are placed, and the cross-sectional views of a part where the current detection part detecting the current of the connecting wiring line 110v2 and the disconnection mechanism disconnecting the connecting wiring line 110v2 are placed can also be expressed in the same way. FIG. 8A shows the A-A cross-sectional view of the current sensor 100 in the normal case (the case where no overcurrent flows through the connecting wiring lines 110). FIG. 8B shows the A-A cross-sectional view of the current sensor 100 in the case where the disconnection mechanism is driven. FIG. 8C is the B-B cross-sectional view of the current sensor 100, i.e., a cross-sectional view of the current sensor 100 in side view viewed from a direction parallel to the connecting wiring lines 110. FIG. 8D is the C-C cross-sectional view of the current sensor 100, i.e., a cross-sectional view of a part including the disconnection mechanism of the current sensor 100 in side view viewed from the direction parallel to the connecting wiring line 110.

As shown in FIGS. 8A-8D, the current sensor 100 includes a magnetic core 101v1, a Hall device 102v1, a circuit substrate 103, a piston 104 (104v1), a cylinder 105, a housing 106, a through hole 107v1, and so forth, concerning the connecting wiring line 110v1. Also, the current sensor 100 includes a magnetic core 101w1, a Hall device 102w1, the circuit substrate 103, the piston 104 (104w1), the cylinder 105, the housing 106, a through hole 107w1, and so forth, concerning the connecting wiring line 110w1. Also, the current sensor 100 includes a magnetic core 101u2, a Hall device 102u2, the circuit substrate 103, the piston 104 (104u2), the cylinder 105, the housing 106, a through hole 107u2, and so forth, concerning the connecting wiring line 110u2. Also, the current sensor 100 includes a magnetic core 101v2, a Hall device 102v2, the circuit substrate 103, the piston 104 (104v2), the cylinder 105, the housing 106, a through hole 107v2, and so forth, concerning the connecting wiring line 110v2. The connecting wiring lines 110v1, 110w1, 110u2, and 110v2, respectively, pass through the through holes 107v1, 107w1, 107u2, and 107v2, i.e., the current sensor 100 is arranged in such a manner as to surround the connecting wiring lines 110v1, 110w1, 110u2, and 110v2 that are the bus bars.

As shown in FIGS. 8A-8C, in the same way as the first and second embodiments, the current sensor 100 is a current sensor of a non-contact type (a magnetic type), and the current detection parts using the magnetic cores and the Hall devices are installed for the respective connecting wiring lines 110v1, 110w1, 110u2, and 110v2. The output circuits outputting the outputs of the respective Hall devices 102v1, 102w1, 102u2, and 102v2 as the output signals corresponding to the currents flowing through the respective connecting wiring lines 110v1, 110w1, 110u2, and 110v2 are installed on the circuit substrate 103. Note that, the circuit substrate 103 can include, in the same way as the first and second embodiments, a power source for driving the current sensor 100, and so forth. The magnetic cores 101v1, 101w1, 101u2, and 101v2, the Hall devices 102v1, 102w1, 102u2, and 102v2, and the circuit substrate 103 are housed in the same housing 106.

As shown in FIGS. 8A, 8B, and 8D, in the same way as the first and second embodiments, the piston 104 is installed slidable in the cylinder 105 as the disconnection mechanism for the connecting wiring lines 110v1, 110w1, 110u2, and 110v2. The piston 104 includes a piston 104v1 pressing and disconnecting the connecting wiring line 110v1, a piston 104w1 pressing and disconnecting the connecting wiring line 110w1, a piston 104u2 pressing and disconnecting the connecting wiring line 110u2, and a piston 104v2 pressing and disconnecting the connecting wiring line 110v2. The pistons 104v1, 104w1, 104u2, and 104v2 have a one-piece structure, and the pistons 104v1, 104w1, 104u2, and 104v2 operate as one piece. The disconnection mechanism (the piston 104 and the cylinder 105) is housed in the same housing 106 where the current detection parts (the magnetic cores 101v1, 101w1, 101u2, and 101v2, the Hall devices 102v1, 102w1, 102u2, and 102v2, the circuit substrate 103, and so forth) is housed.

As shown in FIG. 8B, in the same way as the first and second embodiments, as a result of the piston 104 (104v1) being driven and projecting downward, it is possible therewith to press and break the connecting wiring line 110 (110v1), and disconnect the connecting wiring line 110v1. In the same way, as a result of also the pistons 104w1, 104u2, and 104v2 projecting downward, it is possible therewith to press and break the connecting wiring lines 110w1, 110u2, and 110v2, and disconnect the connecting wiring lines 110w1, 110u2, and 110v2. Details such as the actual structure of the piston 104, the driving method, and so forth, are the same as those of the first and second embodiments. Therefore, the description thereof will be omitted.

Thus, also in the power conversion apparatus 2 outputting the two systems of three-phase alternating currents, in the same way as the first and second embodiments, it is possible to improve the space efficiency by placing the current detection parts and the disconnection mechanism in the same housing in comparison to a case where the current sensor and the disconnection mechanism are installed separately. Further, by installing the current detection circuits of the current sensor (for example, the output circuits and so forth) and the drive circuit driving the disconnection mechanism (for example, the circuit outputting the ignition signal to the igniter) on the same substrate, and placing them in the same housing, it is possible to improve the space efficiency and reduce the cost.

For controlling the MG 40a (feedback control), the current sensor detecting the currents for the two phases from among the three phases of the connecting wiring lines 110u1, 110v1, and 110w1 are needed. Also, for controlling the MG 40b (feedback control), the current sensor detecting the currents for the two phases from among the three phases of the connecting wiring lines 110u2, 110v2, and 110w2 are needed. Therefore, the current detection parts detecting the respective currents of the adjacent connecting wiring lines 110v1 and 110w1 of the V-phase and the W-phase of the MG 40a and the current detection parts detecting the respective currents of the adjacent connecting wiring lines 110u2 and 110v2 of the U-phase and the V-phase of the MG 40b are housed (integrated) in the same housing. Thereby, it is possible to reduce the space required for the current sensor. As a result, it is possible to integrate the disconnection mechanism for disconnecting the connecting wiring lines 110v1, 110w1, 110u2, and 110v2 (uniting the pistons disconnecting the connecting wiring lines 110v1, 110w1, 110u2, and 110v2 into one piece). Thus, it is possible to further reduce the space required to add the disconnection mechanism. Also, by integrating the disconnection mechanism, it is possible to integrate the circuit driving the disconnection mechanism. Thus, it is possible to further reduce the space and the cost required to add the disconnection mechanism.

Note that, in the present embodiment, the current sensor 100 is the magnetic current sensor using the Hall devices. However, as the current detection parts, another type of a current sensor can be used, in the same way as the first and second embodiments.

Next, operations of the MG-ECU 50 if an overcurrent is detected will be descried.

The MG-ECU 50 calculates the current values of the connecting wiring lines 110 (110u1, 110v1, 110w1, 110u2, 110v2, and 110w2) based on the output signals from the current sensor 100, and determines whether an overcurrent is flowing.

If determining that an overcurrent is flowing through any one of the connecting wiring lines 110 (110u1, 110v1, 110w1, 110u2, 110v2, and 110w2), the MG-ECU 50 transmits the driving signal to the drive circuit included in the circuit substrate 103 of the current sensor 100.

The drive circuit of the current sensor 100 drives the disconnection mechanism (the piston 104) based on the driving signal, and breaks and disconnects the connecting wiring lines 110v1, 110w1, 110u2, and 110v2.

Therefore, in the same way as the first embodiment, it is possible to disconnect the two connecting wiring lines 110v1 and 110w1 for the MG 40a and the two connecting wiring lines 110u2 and 110v2 for the MG 40b, and electrically separate the inverter 20 (the power conversion apparatus 2) and the MGs 40a and 40b. Thereby, it is possible to avoid a failure in the MGs 40a and 40b, abnormal heat generation in the circuits, and so forth occurring due to an overcurrent continuously flowing.

[Variants]

Next, the variant of the current sensor 100 according to each of the above-described embodiments will be described.

Note that, a current sensor which will be described below can be applied to any one of the above-mentioned respective embodiments. However, a case where the variant of the current sensor 100 is applied to the first embodiment will be described.

Figure 9A:
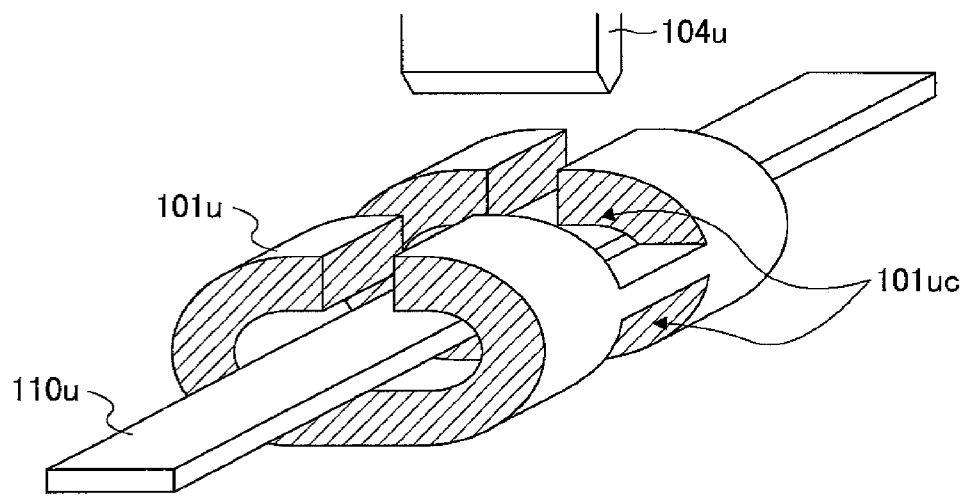
FIG. 9A is a schematic view sowing a variant of a structure of a current sensor.
Figure 9B:
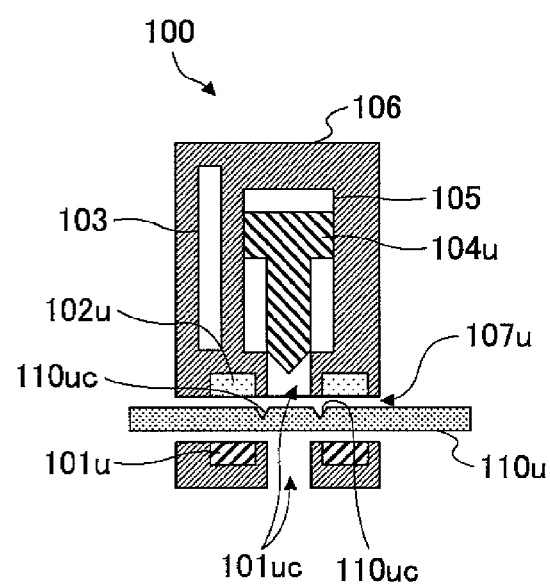
FIG. 9B, is a schematic view showing the variant of the structure of the current sensor.
Figure 9C:
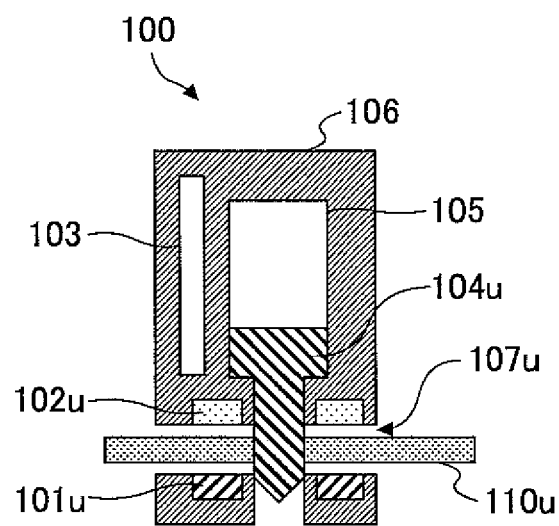
FIG. 9C is a schematic view showing the variant of the structure of the current sensor.

FIGS. 9A-9C illustrate the variant of the current sensor 100. FIG. 9A is a perspective view showing a structure of a magnetic core 101u of the current sensor 100 (100u) according to the variant. FIGS. 9B and 9C are A-A cross-sectional views of the current sensor 100 (in FIG. 2) according to the variant (100u), i.e., cross-sectional views of the current sensor 100 (100u) in side view viewed from a direction perpendicular to the connecting wiring line 110u. FIG. 9B shows the A-A cross-sectional view of the current sensor 100u in the normal case (the case where no overcurrent is flowing through the connecting wiring line 110u). FIG. 9C shows the A-A cross-sectional view of the current sensor 100u in the case where the disconnection mechanism is driven. Note that although FIGS. 9A-9C show the structure of the current sensor 100u, also the current sensor 100w has the same structure.

As shown in FIG. 9A, the magnetic core 101u of the current sensor 100 (100u) according to the variant has cut-out parts 101uc. The cut-out parts 101uc are formed in such a manner that the connecting wiring line 110u that is the bus bar is exposed (viewable) when it is viewed from an operation direction of a piston 104u and the direction opposite thereto. That is, the piston 104u is passible through the magnetic core 101u when the piston 104u projects in the operation direction.

As shown in FIGS. 9B and 9C, the magnetic core 101u and the disconnection mechanism (the piston 104u and a cylinder 105u) are installed in such a manner as to overlap in the direction of laying the connecting wiring line 110u. When the disconnection mechanism is driven, the piston 104u projects downward, presses the connecting wiring line 110u while passing through the cut-out parts 101uc of the magnetic core 101u, and breaks and disconnects the connecting wiring line 110u. When the piston 104u presses the connecting wiring line 110u, the magnetic core 101u can support the connecting wiring line 110u from the bottom side at both ends of the cut-out part 101uc. Thus, bending of the connecting wiring line 110u can be reduced, and thus, the connecting wiring line 110u can be more positively disconnected. As shown in FIG. 9B, it is also possible to form groove parts 110uc in the connecting wiring line 110u that is the bus bar near both ends of the pressed part pressed by the piston 104u so that the connecting wiring line 110u can be easily broken. Thereby, it is possible to more positively disconnect the connecting wiring line 110. By thus employing the configuration where the piston 104u presses the connecting wiring line 110u through the cut-out parts 101uc of the magnetic core 101u, the magnetic core 101u and the disconnection mechanism can overlap in the direction of laying the connecting wiring line. Thereby, it is possible to further reduce the space required for adding the disconnection mechanism (the piston 104u and the cylinder 105u).

Note that, other than forming the groove parts 110uc in the connecting wiring line 110u that is the bus bar, it is also possible to make it easier to break the connecting wiring line 110u by making the width of the pressed part pressed by the piston 104u smaller than the other part, or the like. Such a structure as to make it easier to break the connecting wiring line 110u can be applied also to the connecting wiring lines 110 of each of above-described embodiments.

Thus, the embodiments of the present invention have been described in detail. However, the present invention is not limited to the specific embodiments. It is possible to variously modify or change the embodiments within the scope of the claims.

For example, the current sensors, and the power conversion apparatuses according to the embodiments have been described using the current sensors 100 and the power conversion apparatuses 2 (the inverters 20) having the current sensors 100 installed at the connecting wiring lines of the output sides, installed in the vehicles 1. However, the current sensor can be installed at any wiring line, and can be such as to detect an overcurrent of the wiring line, and disconnect the wiring line. Also, the power conversion apparatus can be such as to be installed in an apparatus or the like other than a vehicle.

The present international application claims the priority of Japanese Patent Application No. 2013-208563, filed on Oct. 3, 2013, and the entire contents of Japanese Patent Application No. 2013-208563 are incorporated in the present international application.

DESCRIPTION OF REFERENCE NUMERALS 1 vehicle
2 power conversion apparatus
10 step-up converter
11 input capacitor
12 reactor
20 inverter
21 smoothing capacitor
30 battery
40, 40a, 40b motor generators (MGs)
50 MG-ECU
100 current sensor
101u, 101v, 101w magnetic cores
101v1, 101w1, 101u2, 101v2 magnetic cores
102u, 102v, 102w Hall devices
102v1, 102w1, 102u2, 102v2 Hall devices
103 circuit substrate (substrate)
103u, 103w circuit substrates (substrates)
104 piston (pressing member)
104u, 104v, 104w pistons (pressing members)
104v1, 104w1, 104u2, 104v2 pistons (pressing members)
105 cylinder
105u, 105w cylinders
106 housing
106u, 106w housings
110 connecting wiring line
110u, 110v, and 110w connecting wiring lines
110u1, 110v1, 110w1 connecting wiring lines
110u2, 110v2, 110w2 connecting wiring lines
120 connection terminal
SW11, 12 transistors
SW21 through SW26 transistors
SW31 through SW36 transistors

The invention claimed is:

1. A current sensor comprising, in the same housing:
a current detection part that detects a current flowing through a wiring line;
a disconnection mechanism that disconnects the wiring line, the disconnection mechanism having a pressing member that breaks the wiring line by applying a pressing force to a part of the wiring line; and
a drive circuit that drives the disconnection mechanism, wherein
a current detection circuit included in the current detection part and the drive circuit are placed on the same substrate,
the current detection part includes a magnetic core arranged in such a manner as to surround the wiring line in cross section of the wiring line, a Hall device inserted in the magnetic core at a part in a circumferential direction of the magnetic core, and an output circuit included in the current detection circuit, the output circuit outputting an output signal according to the current flowing through the wiring line based on an output of the Hall device,
the magnetic core has a cut-out part, the pressing member being passable through the cut-out part in an operation direction of the pressing member, and
the pressing member applies the pressing force to the wiring line at a part exposed through the cut-out part.

2. The current sensor as claimed in claim 1, wherein the wiring line is a bus bar.

3. A power conversion apparatus connected to a predetermined load, comprising:
the current sensor claimed in claim 2, wherein
the current sensor is provided in such a manner as to detect the current that flows through the connecting wiring line connected with the predetermined load.

4. The power conversion apparatus as claimed in claim 3, wherein
the current detection part detects the currents that flow through a plurality of connecting wiring lines included in the connecting wiring line, and
the disconnection mechanism disconnects the plurality of the connecting wiring lines.

5. The power conversion apparatus as claimed in claim 4, wherein
the predetermined load is a rotating electric motor driven by three-phase alternating currents, and
the plurality of the connecting wiring lines are at least any two wiring lines from among a U-phase line, a V-phase line, and a W-phase line for supplying power to the rotating electric motor.

6. A power conversion apparatus connected to a predetermined load, comprising:
the current sensor claimed in claim 1, wherein
the current sensor is provided in such a manner as to detect the current that flows through the connecting wiring line connected with the predetermined load.

7. The power conversion apparatus as claimed in claim 6, wherein
the current detection part detects the currents that flow through a plurality of connecting wiring lines included in the connecting wiring line, and
the disconnection mechanism disconnects the plurality of the connecting wiring lines.

8. The power conversion apparatus as claimed in claim 7, wherein
the predetermined load is a rotating electric motor driven by three-phase alternating currents, and
the plurality of the connecting wiring lines are at least any two wiring lines from among a U-phase line, a V-phase line, and a W-phase line for supplying power to the rotating electric motor.

* * * * *